(12) United States Patent
Cheng et al.

(10) Patent No.: US 11,693,498 B2
(45) Date of Patent: Jul. 4, 2023

(54) TOUCH DISPLAY PANEL AND TOUCH DISPLAY DEVICE

(71) Applicants: WUHAN TIANMA MICROELECTRONICS CO., LTD., Wuhan (CN); WUHAN TIANMA MICROELECTRONICS CO., LTD. SHANGHAI BRANCH, Shanghai (CN)

(72) Inventors: Lin Cheng, Shanghai (CN); Yingying Wu, Shanghai (CN); Peng Zhang, Shanghai (CN); Xinzhao Liu, Shanghai (CN)

(73) Assignees: WUHAN TIANMA MICRO-ELECTRONICS CO., LTD., Wuhan (CN); WUHAN TIANMA MICROELECTRONICS CO., LTD. SHANGHAI BRANCH, Shanghai (CN)

( * ) Notice: Subject to any disclaimer, the term of this patent is extended or adjusted under 35 U.S.C. 154(b) by 58 days.

(21) Appl. No.: 17/363,772

(22) Filed: Jun. 30, 2021

(65) Prior Publication Data
US 2022/0283657 A1 Sep. 8, 2022

(30) Foreign Application Priority Data
Mar. 4, 2021 (CN) .......................... 202110241756.5

(51) Int. Cl.
*G09G 5/00* (2006.01)
*G06F 3/041* (2006.01)
(Continued)

(52) U.S. Cl.
CPC .......... *G06F 3/0412* (2013.01); *G06F 3/0443* (2019.05); *H10K 50/844* (2023.02); *H10K 59/122* (2023.02); *H10K 59/40* (2023.02)

(58) Field of Classification Search
CPC ... G06F 3/0412; G06F 3/0443; H01L 27/323; H01L 27/3246; H01L 51/5253; H10K 59/40; H10K 59/122
(Continued)

(56) References Cited

U.S. PATENT DOCUMENTS

2020/0409485 A1* 12/2020 Gwon .................... G06F 3/0443
2021/0149524 A1* 5/2021 Bang .................... G06F 3/04164
(Continued)

*Primary Examiner* — Jennifer T Nguyen
(74) *Attorney, Agent, or Firm* — Alston & Bird LLP

(57) ABSTRACT

A touch display panel includes a substrate including display region and non-display region; light-emitting elements disposed in the display region; encapsulation layer including at least one inorganic layer and at least one organic layer that are stacked; touch layer disposed on a side of the at least one inorganic layer facing away from the light-emitting elements; plurality of touch wires extending to the non-display region along first direction; and step region including first region with at least one wall and second region with plurality of touch terminals, where at least part of the touch terminals are electrically connected to the touch wires in one-to-one manner, the second region includes at least one blocking column which extends along second direction and configured to prevent the at least one inorganic layer disposed between the touch layer and the substrate and in the encapsulation layer from extending to the touch terminals.

20 Claims, 11 Drawing Sheets

(51) Int. Cl.
  *G06F 3/044*     (2006.01)
  *H10K 50/844*    (2023.01)
  *H10K 59/40*     (2023.01)
  *H10K 59/122*    (2023.01)

(58) Field of Classification Search
  USPC ........................................................ 345/173
  See application file for complete search history.

(56)              References Cited

U.S. PATENT DOCUMENTS

2021/0165517 A1* 6/2021 Lee .................... H01L 51/5253
2021/0175292 A1* 6/2021 Bang .................... G06F 3/0416
2021/0273198 A1* 9/2021 Cheng .................... H01L 51/56
2021/0333919 A1* 10/2021 Wu .................... H01L 51/5237

* cited by examiner

TOUCH DISPLAY PANEL AND TOUCH DISPLAY DEVICE

CROSS-REFERENCE TO RELATED APPLICATION(S)

This application claims priority to Chinese Patent Application No. CN202110241756.5, titled "TOUCH DISPLAY PANEL AND TOUCH DISPLAY DEVICE" and filed Mar. 4, 2021, the disclosure of which is incorporated herein by reference in its entirety.

TECHNICAL FIELD

Embodiments of the present disclosure relate to display technology and, in particular, to a touch display panel and a touch display device.

BACKGROUND

A touch operation is a simple and convenient man-machine interaction mode and thus a touch function has been integrated to display panels that are used in an increasing number of products. Touch panels may be categorized by structure into add-on-mode touch panels, on-cell touch panels, and in-cell touch panels. Among the three types of touch panels, the in-cell touch panels are widely used, in which touch electrodes are disposed inside a display panel, thereby reducing the overall thickness of a module and lowering manufacturing cost of the touch panel.

In preparing a display panel, a bent region is usually disposed in a non-display region to narrow a bezel of the display panel. Transferring apertures are disposed at both sides of the bent region to transfer touch wires to transferring wires in another layer through touch terminals. Some inorganic layers in the display panel are generally formed through a chemical vapor deposition (CVD) process. When the bezel of the display panel is relatively narrow, the CVD boundary may cover the transfer apertures, resulting in abnormal contact between touch wires and touch terminals, and thus affecting the touch performance.

SUMMARY

Embodiments of the present disclosure provide a touch display panel and a touch display device. The risk of abnormal contact between touch wires and touch terminals can be reduced in this touch display panel, and thereby the touch performance of this touch display panel can be improved.

In a first aspect, embodiments of the present disclosure provide a touch display panel. The touch display panel includes a substrate, light-emitting elements, an encapsulation layer, a touch layer, and a plurality of touch wires.

The substrate includes a display region and a non-display region. The non-display region includes a step region.

The light-emitting elements are disposed in the display region.

The encapsulation layer covers the light-emitting elements and at least part of the non-display region and includes at least one inorganic layer and at least one organic layer. The at least one inorganic layer and the at least one organic layer are stacked.

The touch layer is disposed on a side of the at least one inorganic layer facing away from the light-emitting elements. The touch layer includes a plurality of touch electrodes.

The touch wires are connected to the touch electrodes and extend to the non-display region along a first direction.

The step region includes a first region and a second region. The first region is disposed adjacent the display region. The second region is disposed on a side of the first region facing away from the display region. The first region includes at least one wall. The second region includes a plurality of touch terminals. At least part of the touch terminals are electrically connected to at least part of the touch wires in a one-to-one manner.

The second region includes at least one blocking column extending along a second direction. The first direction and the second direction intersect. In a direction perpendicular to a plane in which the substrate is located, the at least one blocking column overlaps the touch wires extending to the non-display region.

At least part of the at least one blocking column is disposed between the touch terminals and the at least one wall. The at least one blocking column prevents the at least one inorganic layer disposed between the touch layer and the substrate in the encapsulation layer from extending to the touch terminals.

In a second aspect, embodiments of the present disclosure provide a touch display device including any one of the preceding touch display panels.

The display panel provided by embodiments of the present disclosure includes a substrate, light-emitting elements, an encapsulation layer, a touch layer, and a plurality of touch wires. The substrate includes a display region and a non-display region. The non-display region includes a step region. The light-emitting elements are disposed in the display region. The encapsulation layer covering the light-emitting elements and at least part of the non-display region and includes at least one inorganic layer and at least one organic layer. The at least one inorganic layer and the at least one organic layer are stacked. The touch layer is disposed on a side of the at least one inorganic layer facing away from the light-emitting elements. The touch layer includes a plurality of touch electrodes. The touch wires are connected to the touch electrodes and extend to the non-display region along a first direction. The step region includes a first region and a second region. The first region is disposed adjacent the display region. The second region is disposed on a side of the first region facing away from the display region. The first region includes at least one wall. The second region includes a plurality of touch terminals. At least part of the touch terminals are electrically connected to at least part of the touch wires in a one-to-one manner. The second region includes at least one blocking column extending along a second direction. The first direction and the second direction intersect. In a direction perpendicular to a plane in which the substrate is located, the at least one blocking column overlaps the touch wires extending to the non-display region. At least part of the at least one blocking column is disposed between the touch terminals and the at least one wall. The blocking column prevents the at least one inorganic layer disposed between the touch layer and the substrate in the encapsulation layer from extending to the touch terminals.

DETAILED DESCRIPTION

Figure 1:
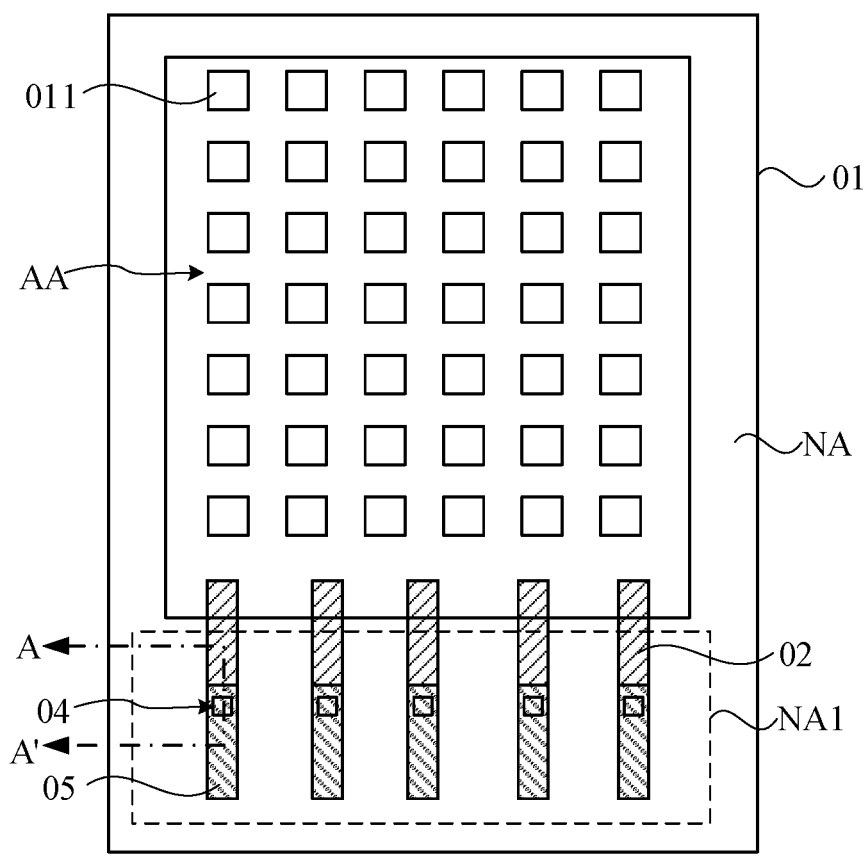
FIG. 1 is a schematic view illustrating a structure of a display panel in the related art.

The present disclosure is further described hereinafter in detail in conjunction with drawings and embodiments. It is to be understood that embodiments described hereinafter are intended to explain the present disclosure and not to limit the present disclosure. Additionally, it is to be noted that for ease of description, only part, not all, of structures related to the present disclosure are illustrated in the drawings.

Terms used in embodiments of the present disclosure are merely used to describe specific embodiments and not intended to limit the present disclosure. It is to be noted that nouns of locality, including "on", "below", "left" and "right", used in embodiments of the present disclosure are described from the angles illustrated in the drawings and are not to be construed as a limitation to embodiments of the present disclosure. Additionally, in the context, it is to be understood that when an element is formed "on" or "below" another element, the element may be directly formed "on" or "below" another element, or may be indirectly formed "on" or "below" another element via an intermediate element. The terms "first", "second" and the like are merely used for description and used to distinguish between different components rather than indicate any order, quantity, or importance. For those of ordinary skill in the art, the preceding terms can be construed according to specific situations in the present disclosure. In the following examples, the x-axis, the y-axis, and the z-axis are not limited to three axes in a rectangular coordinate system, and may be construed in a broader sense. For example, the x-axis, the y-axis, and the z-axis may be perpendicular to each other, or may represent different directions that are not perpendicular to each other.

It is obvious for those skilled in the art that various modifications and changes in the present disclosure may be made without departing from the spirit or scope of the present disclosure. Accordingly, the present disclosure is intended to cover modifications and variations of the present disclosure that fall within the scope of the appended claims (the claimed technical solutions) and their equivalents. It is to be noted that embodiments of the present disclosure, if not in collision, may be combined with each other.

Figure 2:
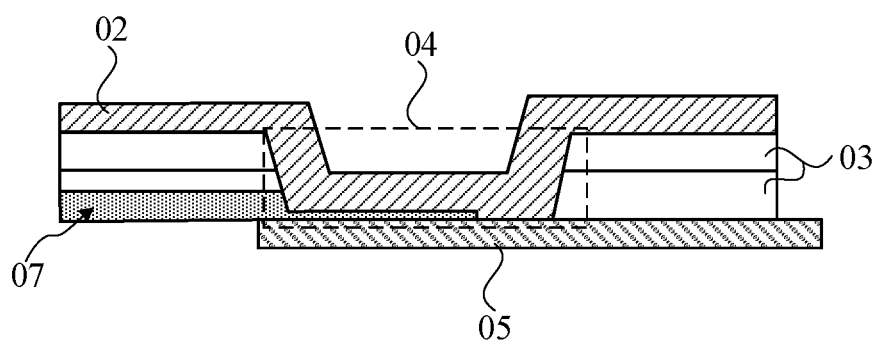
FIG. 2 is a schematic section view taken along line AA' of FIG. 1.

FIG. 1 is a schematic view illustrating the structure of a display panel in the related art. FIG. 2 is a schematic section view taken along line AA' of FIG. 1. Referring to FIG. 1, the display panel includes a display region AA and a non-display region NA. A substrate 01 of the display panel is divided into the display region AA provided with display devices 011 and the non-display region NA surrounding the display region AA. The display devices 011 are configured to display images and include a plurality of sub-pixels that can emit light of different colors. The substrate 01 may include various flexible or flectional materials, for example, polymer resins such as polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP).

The non-display region NA includes a plurality of touch wires 02 for transmitting driving signals in the touch driver chip to touch electrodes in the display region. Accordingly, in a lower step region NA1 of the non-display region, a touch wire 02 and a touch terminal 05 in the driver chip need to be electrically lap-jointed. Since the touch wire 02 and the touch terminal 05 are disposed in different layers, the touch wire 02 is electrically connected to the touch terminal 05 through a via 04 in general.

FIG. 2 shows an example in which the touch wires 02 are disposed on an encapsulation layer. A touch wire 02 is electrically connected to a touch terminal 05 through a via 04 disposed in insulating layers 03 (the insulating layers 03 may include a plurality of layers and FIG. 2 shows two exemplary insulating layers) below the touch wire 02. In preparing the display panel, the CVD process for preparing an inorganic layer in the encapsulation layer has a large fluctuation in CVD shadow 07. In this case, the inorganic layer may at least partially cover the via 04, making the via 04 unable to be etched thoroughly. The inorganic layer in the encapsulation layer may even cover the via 04 completely. Accordingly, an abnormal contact between the touch wire 02 and the touch terminal 05 is caused, which affects the touch performance.

In view of the preceding, embodiments of the present disclosure provide a touch display panel. The touch display panel includes a substrate, light-emitting elements, an encapsulation layer, a touch layer, and a plurality of touch wires. The substrate includes a display region and a non-display region. The non-display region includes a step region. The light-emitting elements are disposed in the display region. The encapsulation layer covers the light-emitting elements and at least part of the non-display region and includes at least one inorganic layer and at least one organic layer. The at least one inorganic layer and the at least one organic layer are stacked. The touch layer is disposed on a side of the at least one inorganic layer facing away from the light-emitting elements. The touch layer includes a plurality of touch electrodes. The touch wires are connected to the touch electrodes and extend to the non-display region along a first direction. The step region includes a first region and a second region. The first region is disposed adjacent the display region. The second region is disposed on a side of the first region facing away from the display region. The first region includes at least one wall. The second region includes a plurality of touch terminals. At least part of the touch terminals are electrically connected to at least part of the touch wires in a one-to-one manner. The second region includes at least one blocking column extending along a second direction. The first direction and the second direction intersect. In a direction perpendicular to a plane in which the substrate is located, the at least one blocking column overlaps the touch wires extending to the non-display region. At least part of the at least one blocking column is disposed between the touch terminals and the at least one wall. The at least one blocking column prevents the at least one inorganic layer disposed between the touch layer and the substrate in the encapsulation layer from extending to the touch terminals.

The touch display panel provided in this embodiment may be an organic light-emitting display panel. In an organic light-emitting display panel, a thin-film encapsulation layer is formed through the thin-film encapsulation (TFE) process to prevent water vapor and oxygen from affecting organic light-emitting elements. The touch electrodes may be formed on at least one layer in the thin-film encapsulation layer. For example, the touch electrodes may be disposed inside the thin-film encapsulation layer. Alternatively, the touch electrodes may be disposed above the thin-film encapsulation layer to form a TP-on-TFE (TPOT) structure.

As for the technical solutions in embodiments of the present disclosure, the arrangement in which a touch layer is disposed on a side of the at least one inorganic layer in the encapsulation layer facing away from the light-emitting elements to form an in-cell touch structure helps achieve a light and thin touch display panel. The at least one wall disposed in the first region of the non-display region blocks an organic layer in the encapsulation layer. The at least one blocking column disposed in the second region and intersecting the touch wires prevents the at least one inorganic layer disposed between the touch layer and the substrate in the encapsulation layer from extending to the touch terminals, thereby avoiding covering transfer apertures at the CVD boundary, which prevents contact between the touch wires and the touch terminals from being abnormal and the touch performance of the touch display panel from being affected when the at least one inorganic layer covers the transferring apertures, and thus the touch performance of the touch display panel is enhanced.

The preceding is the core concept of the present disclosure. The technical solutions in embodiments of the present disclosure are described hereinafter clearly and completely in conjunction with the drawings in embodiments of the present disclosure.

Figure 3:
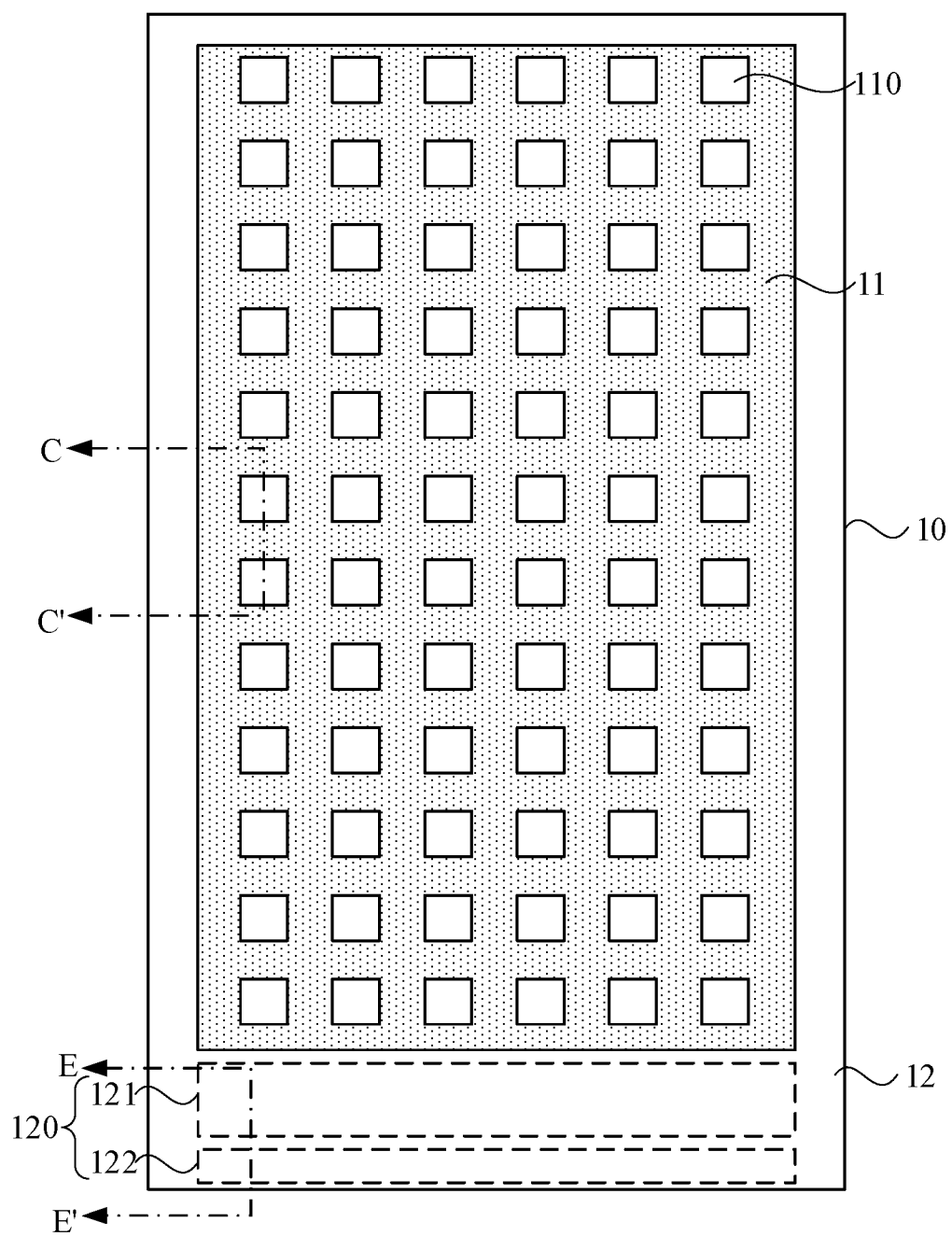
FIG. 3 is a schematic top view illustrating a structure of a touch display panel according to embodiments of the present disclosure.
Figure 4:
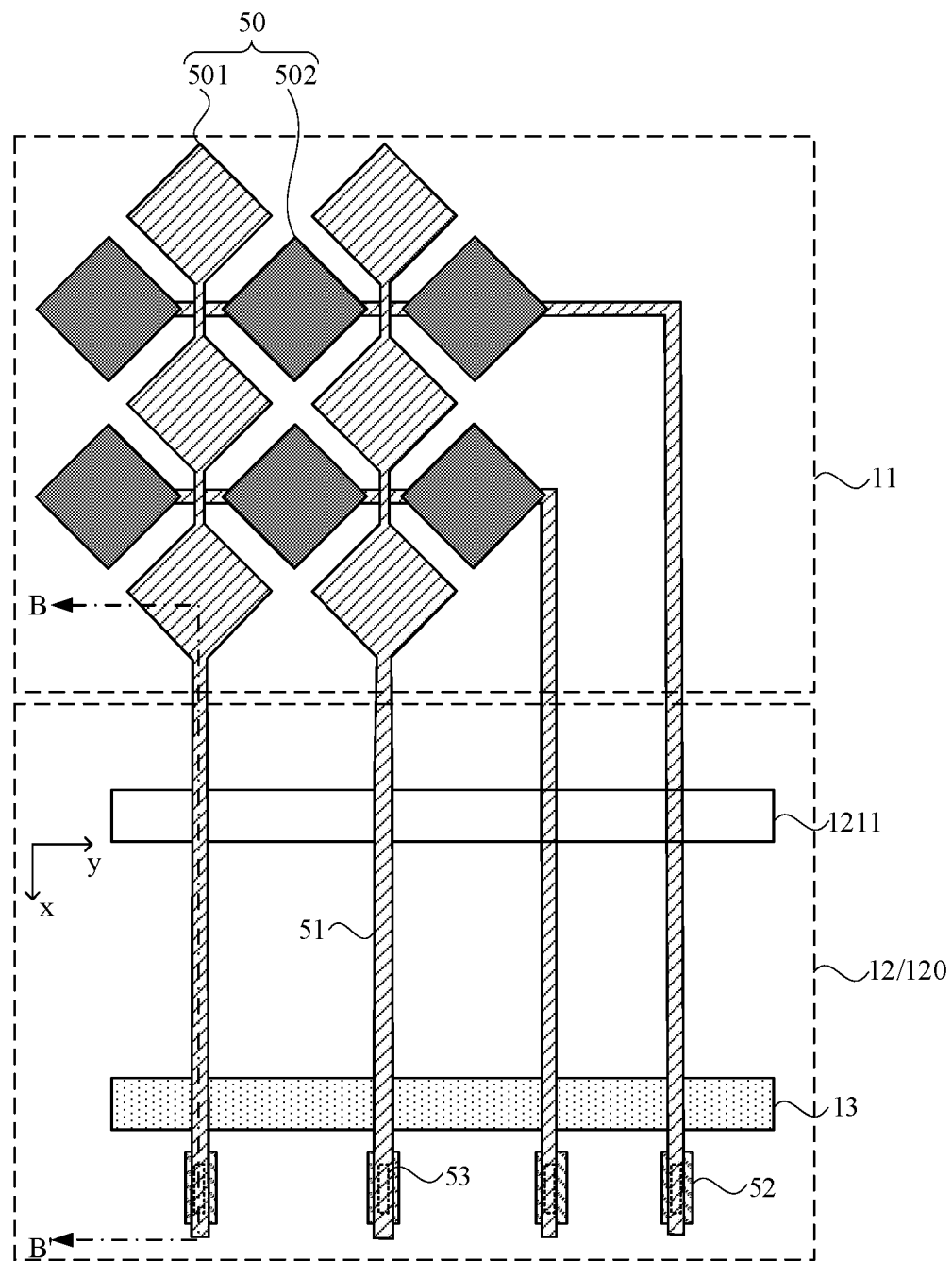
FIG. 4 is a schematic top view illustrating part of a non-display region in FIG. 3.
Figure 5:
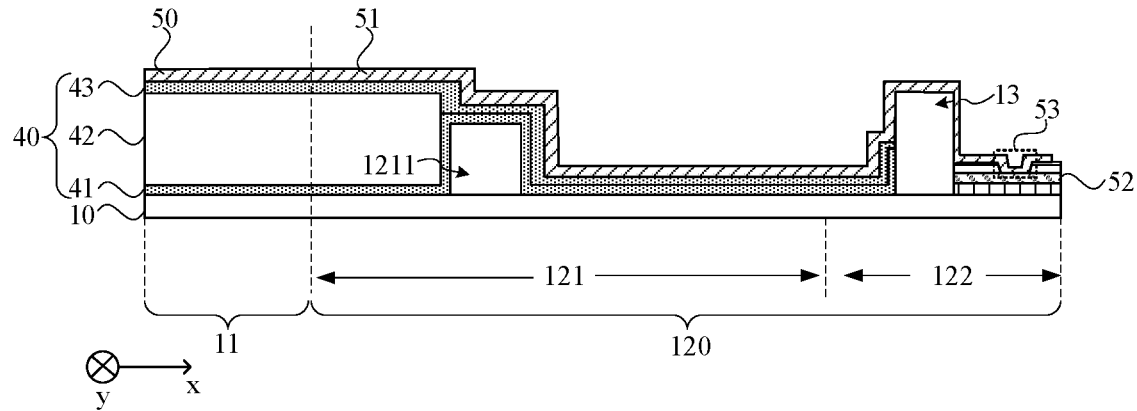
FIG. 5 is a schematic section view taken along line BB' of FIG. 4.

FIG. 3 is a schematic top view illustrating the structure of a touch display panel according to an exemplary embodiment of the present disclosure. FIG. 4 is a schematic top view illustrating part of a non-display region in FIG. 3. FIG. 5 is a schematic section view taken along line BB' of FIG. 4. Referring to FIGS. 3 to 5, the touch display panel provided in this embodiment includes a substrate 10. The substrate 10 includes a display region 11 and a non-display region 12. The non-display region 12 includes a step region 120. Light-emitting elements 110 are disposed in the display region 11 in an array. The light-emitting elements 110 may include light-emitting elements 110 that emit light of different colors, for example, including light-emitting elements 110 that emit red light, green light, and blue light. FIG. 3 only exemplarily shows that the light-emitting elements 110 are disposed in the display region, with any limitation on neither the emitting colors of the light emitting devices 110 nor the arrangement mode of the light emitting devices 110.

Specifically, the touch display panel includes an encapsulation layer 40. The encapsulation layer 40 covers the light-emitting elements and at least part of the non-display region 12 and includes at least one inorganic layer and at least one organic layer. The at least one inorganic layer and the at least one organic layer are stacked. Exemplarily, in an embodiment, as shown in FIG. 5, the encapsulation layer 40 may be a thin-film encapsulation layer disposed above the light-emitting elements. The encapsulation layer 40 includes a first inorganic layer 41, a first organic layer 42, and a second inorganic layer 43. The first inorganic layer 41, the first organic layer 42, and the second inorganic layer 43 are stacked along the direction of light emission of the touch display panel to prevent water and oxygen from corroding the light-emitting elements. The first inorganic layer 41 may include at least one of silicon oxide, silicon nitride, or silicon oxynitride. Since the first inorganic layer 41 is formed along a structure below the first inorganic layer 41, an upper surface of the first inorganic layer 41 is generally non-planar. Unlike the first inorganic layer 41, a thickness of the first organic layer 42 covering the first inorganic layer 41 is generally greater than a thickness of the first inorganic layer 41. Accordingly, the first organic layer 42 may have a planar upper surface in an implementation. In other embodiments, the upper surface of the first organic layer 42 may be non-planar, which may be designed according to actual situations in a specific implementation. The first organic layer 42 may include at least one combination selected from combinations consisting of PET, PEN, PC, PI, PES, polyoxymethylene (POM), polyacrylate, or hexamethyldisiloxane (HMDSO). The second inorganic layer 43 may cover the first organic layer 42 and include at least one of silicon oxide, silicon nitride, or silicon oxynitride. The periphery of the second inorganic layer 43 disposed outside the display region 11 may contact the first inorganic layer 41 to prevent the first organic layer 42 from being exposed to the outside. In other embodiments, the encapsulation layer 40 may include more inorganic layers and more organic layers. Since the encapsulation layer 40 is in a multilayer structure including the first inorganic layer 41, the first organic layer 42, and the second inorganic layer 43, a crack, even when existing in the encapsulation layer 40, does not extend between the first inorganic layer 41 and the first organic layer 42 or between the first organic layer 42 and the second inorganic layer 43. Accordingly, the external moisture or oxygen may be prevented from permeating into the display region 11.

Referring to FIG. 4, the touch display panel further includes a touch layer 50. The touch layer 50 is disposed on a side of the at least one inorganic layer facing away from the light-emitting elements. The touch layer 50 includes a plurality of touch electrodes. In a specific implementation, the touch electrodes in the touch layer 50 may be disposed in one layer or in two layers and may be formed by using transparent metal oxides such as indium tin oxide (ITO) or by using metal meshes formed by metal wires. The arrangement of the touch electrodes is not limited in embodiments of the present disclosure. Exemplarily, FIG. 4 shows an example in which the touch electrodes are disposed in mutual capacitance. The touch layer 50 includes a plurality of touch electrodes (501, 502). Specifically, the touch electrodes include a touch driving electrode 501 and a touch sensing electrode 502. The touch driving electrode 501 includes a plurality of driving electrode blocks electrically connected to each other. The touch sensing electrode 502 includes a plurality of sensing electrode blocks electrically connected to each other through bridges. The bridges are disposed in a bridge layer. It is to be understood that the bridge layer may be disposed on a side of the touch layer facing the substrate, or on a side of the touch layer facing away from the substrate, which is not limited in embodiments of the present disclosure herein.

With continued reference to FIG. 4, the touch display panel further includes a plurality of touch wires 51. Each touch driving electrode 501 and each touch sensing electrode 502 is directly electrically connected to a touch wire 51 respectively. It is to be noted that the touch wires 51 may be disposed in a same layer as the touch layer 50, or may be disposed in a same layer as the bridge layer, which is not limited herein.

In this embodiment, as shown in FIG. 5, the touch wires 51 are disposed in the same layer as the touch layer 50. The touch layer 50 is disposed on a side of the second inorganic layer 43 facing away from the first organic layer 41. The first organic layer 41 extends to a side of the at least one wall 1211 facing the display region 11. The first inorganic layer 41 and/or the second inorganic layer 43 extends at most to a side of the at least one blocking column 13 facing the at least one wall 1211.

The touch wires 51 extend along a first direction x to the non-display region 12. The step region 120 includes a first region 121 and a second region 122. Referring to FIG. 3 or 4, the first region 121 is disposed adjacent the display region 11. The second region 122 is disposed on a side of the first region 121 facing away from the display region 11. The first region 121 includes at least one wall 1211. In an embodiment, as shown in FIG. 5, the first region 121 includes one wall 1211. The second region 122 includes touch terminals 52 correspondingly connected to the touch wires 51. Each touch terminal 52 is connected to a driver chip. The driver chip may be a Touch-and-Display-Driver-Integration (TDDI) chip. In other embodiments, the first region 121 may be provided with two or more walls, to increase an extension path of the inorganic layer, thereby enhancing the effect of blocking water and oxygen.

With continued reference to FIGS. 4 and 5, the second region 122 includes at least one blocking column 13 extending along a second direction y. The first direction x and the second direction y intersect. In a direction perpendicular to a plane in which the substrate 10 is located, the at least one blocking column 13 overlaps the touch wires 51 extending to the non-display region 12. At least a partial region of the at least one blocking column 13 is disposed between the touch terminals 52 and the at least one wall 1211. The at least one blocking column 13 is configured to prevent the at least one inorganic layer disposed between the touch layer 50 and the substrate 10 and in the encapsulation layer from extending to the touch terminals 52.

In this embodiment, as shown in FIGS. 4 and 5, the at least one blocking column 13 is disposed between the touch terminals 52 and the at least one wall 1211. By arranging the at least one blocking column 13 to prevent an inorganic layer (for example, the first inorganic layer 41 and the second inorganic layer 43 in FIG. 5) below the touch layer from extending to the touch terminals 52, an abnormal contact between the touch wires 51 and the touch terminals 52 is avoided.

In another embodiment, part region of the at least one blocking column 13 is disposed between the touch terminals 52 and the at least one wall 1211. That is, a shape of the at least one blocking column is not limited. As long as part of or all of a structure of the at least one blocking column is disposed between the touch terminals 52 and the at least one wall 1211, the inorganic layer below the touch wires 51 can be prevented from covering the touch terminals 52, and thus the reliability of electrical connections between the touch wires 51 and the touch terminals 52 is enhanced.

In embodiments of the present disclosure, the second region 122 may also be provided with two or more blocking columns 13 to enhance the blocking effect on an inorganic layer and further reduce a probability of abnormal contact between the touch wires 51 and the touch terminals 52.

In embodiments of the present disclosure, a wall 1211 is configured to define a boundary of the first organic layer 42 in the encapsulation layer 40. Since the first organic layer 42 in the encapsulation layer 40 is in a fluid state in the preparation and the encapsulation layer 40 is resilient to a certain degree, by the at least one wall 1211 blocking the first organic layer 42 to perform a cutoff function, a narrow bezel is achieved. To ensure that the encapsulation layer 40 blocks water and oxygen, the first inorganic layer 41 and the second inorganic layer 43 are arranged to cover the at least one blocking wall 1211 and extend to the side facing away from the display region 11. In such a way, the first inorganic layer 41 and the second inorganic layer 43 may at least partially cover the touch terminals 52, causing poor contact between the touch wires 51 and the touch terminals 52. In this embodiment, by that the at least one blocking column 13 is disposed on a side of the touch terminals 52 facing the display region 11, the first inorganic layer 41 and the second inorganic layer 43 may extend to a side of the at least one blocking column 13 facing the display region lithe performance of the encapsulation layer 40 blocking water and oxygen is enhanced and the effect of an inorganic layer on the touch terminals 52 is avoided. Both the at least one wall 1211 and the at least one blocking column 13 may be formed by stacking organic layers, which may be selected according to actual conditions in a specific implementation. It is to be understood that, in this embodiment, the main function of the at least one wall 1211 is to define a boundary of the first organic layer 42. Accordingly, the at least one wall 1211 is disposed in an annular structure surrounding the display region 11. To increase the performance of blocking water and oxygen by an inorganic layer in the bezel region, the inorganic layer is designed to cover the at least one wall 1211. The function of the at least one blocking column 13 is to prevent an inorganic layer from extending to vias to cause abnormal contact between the touch wires 51 and the touch terminals 52. Accordingly, the at least one blocking column 13 does not need to be disposed surrounding the display region 11. That is, the at least one blocking column 13 may be in a bar shape and disposed only in the non-display region (exemplarily, the step region 120 of the lower bezel in FIG. 3) provided with the touch terminals 52.

With continued reference to FIG. 5, the first inorganic layer 41 and the second inorganic layer 43 have a same cutoff position in the non-display region. In this case, the first inorganic layer 41 and the second inorganic layer 43 may be formed by using a same mask, which reduces the process difficulty.

Figure 6:
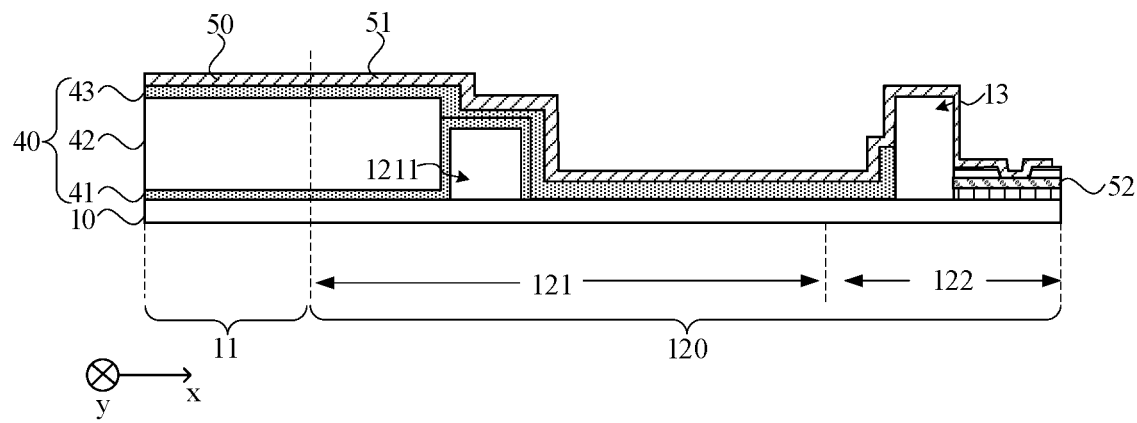
FIG. 6 is another schematic section view taken along line BB' of FIG. 4.

FIG. 6 is another schematic section view taken along line BB' of FIG. 4. Referring to FIG. 6, the cutoff position of the first inorganic layer 41 in the non-display region is disposed on a side of the cutoff position of the second inorganic layer 43 in the non-display region facing the display region.

It is to be understood that, currently, in a narrow step design of the touch display panel, with a flexible substrate adopted, a narrow bezel is achieved by bending a lower step of the flexible substrate. However, a bent region of the flexible substrate is closer to an edge of an inorganic layer. To alleviate the effect of bending stress, a thickness of an inorganic layer is reduced in embodiments of the present disclosure. By arranging the cutoff position of the first inorganic layer 41 closer to the display region, the reliability when the flexible panel is bent is enhanced. For example, in FIG. 6, the first inorganic layer 41 is cut off at a right edge of the at least one wall 1211. To block water and oxygen effectively, the second inorganic layer 43 needs to be designed relatively long, which consequently more likely causes abnormal contact between the touch wires and the touch terminals. In this case, the at least one blocking column 13 is mainly configured to block the second inorganic layer 43.

Figure 7:
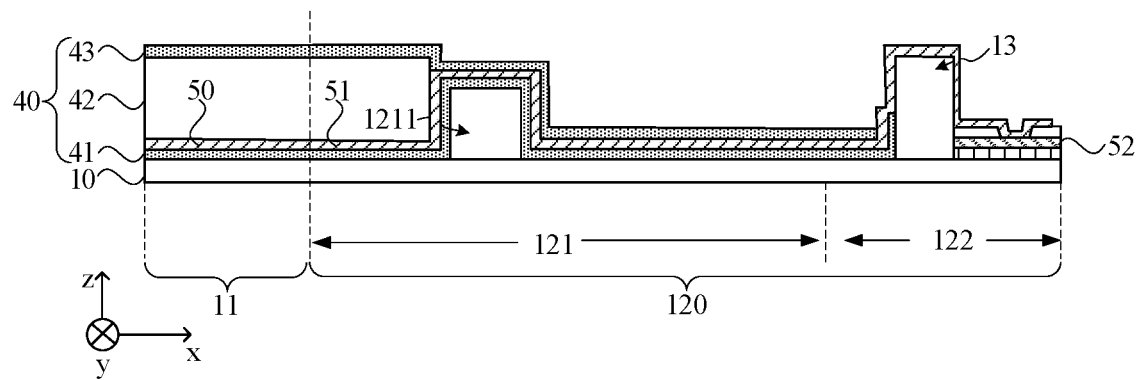
FIG. 7 is yet another schematic section view taken along line BB' of FIG. 4.

In the preceding embodiments, the touch layer is disposed on the thin-film encapsulation layer. In another embodiment, the touch layer may be disposed inside the thin-film encapsulation layer. Exemplarily, FIG. 7 is another schematic section view taken along line BB' of FIG. 4. Referring to FIG. 7, the encapsulation layer 40 includes the first inorganic layer 41, the first organic layer 42, and the second inorganic layer 43. The first inorganic layer 41, the first organic layer 42, and the second inorganic layer 43 are stacked along the direction (the z direction) of light emission of the touch display panel. The touch layer 50 (exemplarily in the same layer as the touch wire 50 in FIG. 7) is disposed between the first inorganic layer 41 and the first organic layer 42. The first organic layer 42 extends to a side of the at least one wall 1211 facing the display region 11. The first inorganic layer 41 extends at most to a side of the at least one blocking column 13 facing the at least one wall 1211.

It is to be understood that the touch layer 50 in this embodiment is disposed inside the encapsulation layer 40. The at least one wall 1211 is configured to block the first organic layer 42 and define the boundary of the first organic layer 42. As the first inorganic layer 41 is disposed below the encapsulation layer 40, if no blocking column 13 is disposed, the first inorganic layer 41 extending to the touch terminals 52 may cause abnormal contact between the touch wires 51 and the touch terminals 52, while the position of the second inorganic layer 43 does not affect electrical connections between the touch wires 51 and the touch terminals 52 through the vias. By arranging the at least one blocking column 13, the boundary of the first inorganic layer 41 can be prevented from covering the touch terminals 52.

It is to be noted that the preceding embodiments only show the layer structures related to the technical solutions in embodiments of the present disclosure. For example, FIGS. 5 to 7 do not show the structures of the array layer and the structures of the display layer of the display panel. The following drawings, similarly, omit part of the layers. In a specific implementation, those skilled in the art may dispose other layers of the touch display panel according to the related art.

Figure 8:
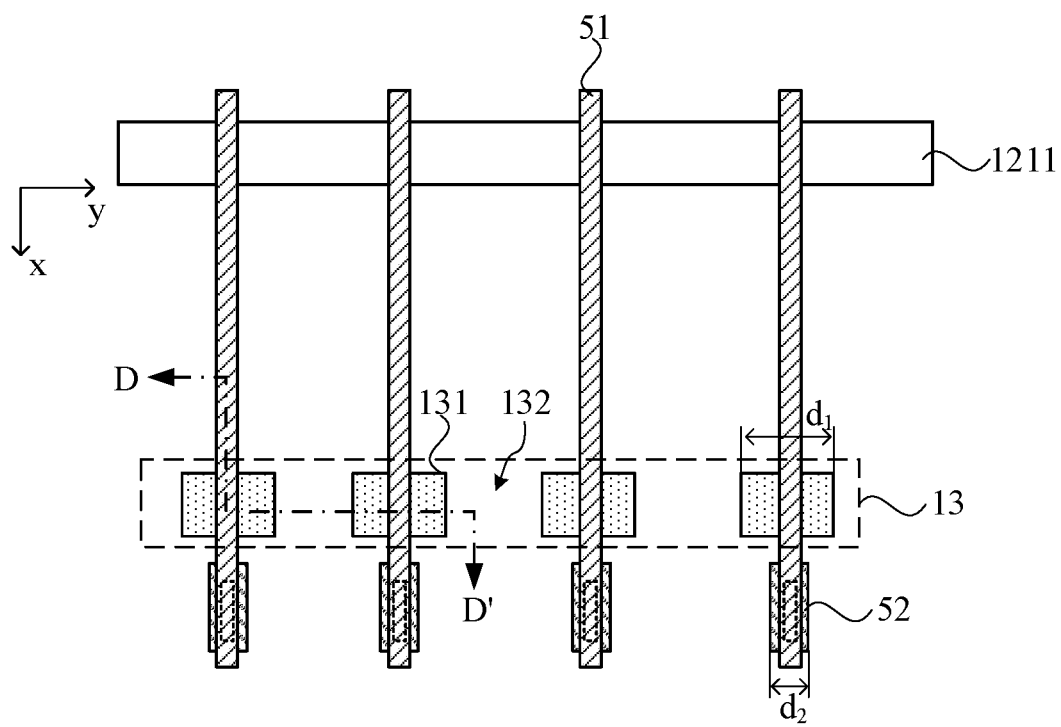
FIG. 8 is a schematic top view illustrating a structure of part of a touch display panel according to embodiments of the present disclosure.
Figure 9:
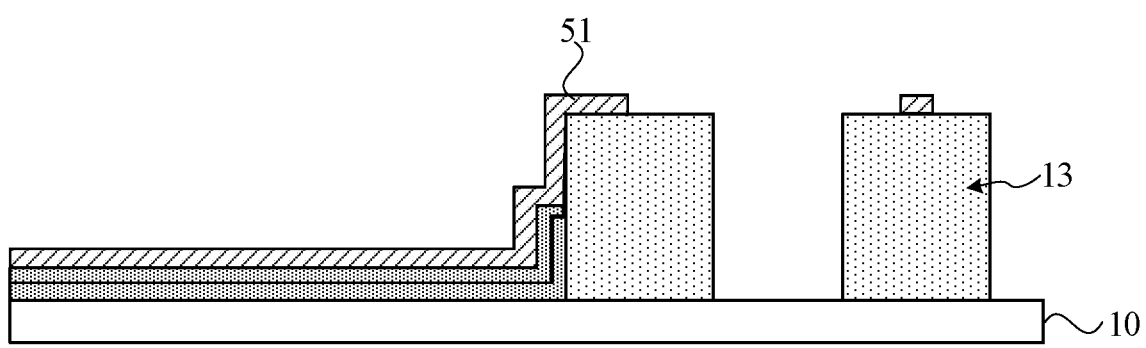
FIG. 9 is a schematic section view taken along line DD' of FIG. 8.

Based on the preceding embodiments, FIG. 8 is a schematic top view illustrating the structure of part of a touch display panel according to embodiments of the present disclosure. FIG. 9 is a schematic section view taken along line DD' of FIG. 8. Referring to FIGS. 8 and 9, a blocking column 13 comprises a plurality of sub-blocking columns 131. In the direction perpendicular to the plane in which the substrate is located, a sub-blocking column 131 overlaps a touch wire 51. The width d1 of the sub-blocking column 131 in the second direction y is greater than or equal to the width d2 of the touch terminal 52 in the second direction y.

It is to be understood that the function of the at least one blocking column 13 is to prevent an inorganic layer below the touch wires 51 from extending to the touch terminals 52 and thus causing abnormal contact between the touch wires 51 and the touch terminals 52. By arranging that a blocking column 13 includes a plurality of sub-blocking columns 131, that the touch wires 51 extend on the sub-blocking columns 131, and that the width d1 of the sub-blocking column 131 in the second direction y is greater than or equal to the width d2 of a touch terminal 52 in the second direction y, the sub-blocking columns 131 may effectively block an inorganic layer extending to the touch terminals 52 and reduces the risk of abnormal contact between the touch wires 51 and the touch terminals 52.

With continued reference to FIG. 8, an opening 132 of the at least one opening 132 is disposed between each two adjacent sub-blocking columns 131. The opening 132 is disposed between two adjacent touch wires 51.

Figure 10:
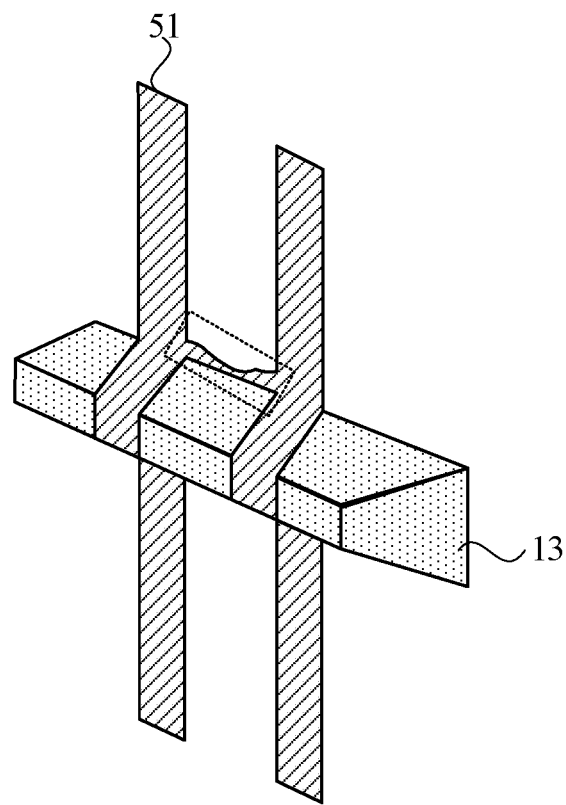
FIG. 10 is a schematic view illustrating that touch wires in a portion with a blocking column are short-circuited.

In this embodiment, since a height difference exists between the at least one blocking column 13 and layers in other regions, two adjacent touch wires are easily short-circuited when the touch wires are formed. Exemplarily, FIG. 10 is a view illustrating that touch wires in a portion with a blocking column are short-circuited. Referring to FIG. 10, when the blocking column 13 is disposed in the touch display panel, the boundary (the region in the dotted box in FIG. 10) of the blocking column 13 may have metal residues that cause a short circuit between two adjacent metal wires 51. With continued reference to FIG. 8, two adjacent sub-blocking columns 131 are disconnected, thereby breaking the short-circuit path caused by metal residues between two adjacent touch wires 51, avoiding a short circuit between two adjacent touch wires 51 due to metal residues, and reducing the risk of a short circuit between two adjacent touch wires 51. In this embodiment, an opening 132 is exemplarily disposed between each two adjacent sub-blocking columns 131 and disposed between each two adjacent touch wires 51. In the preparation of the display panel, the touch wires 51 cover the surface of the at least one blocking column 13. By disposing an opening 132 between each two adjacent sub-blocking columns 13, i.e., removing part of the layers between two adjacent touch wires 51, a short circuit between two adjacent touch wires 51 due to metal residues is avoided, thereby improving the manufacturing yield of the display panel. In other embodiments, two or more openings may be disposed between two adjacent touch wires 51. The design may be made according to actual situations in a specific implementation.

Figure 11:
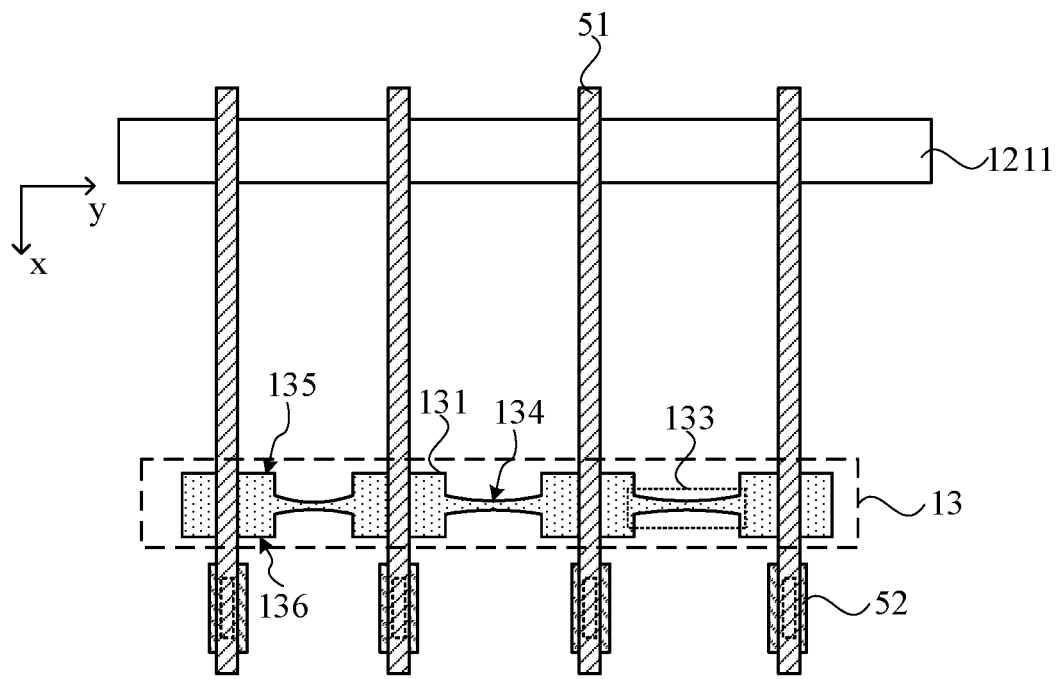
FIG. 11 is a schematic top view illustrating part of another touch display panel according to embodiments of the present disclosure.
Figure 12:
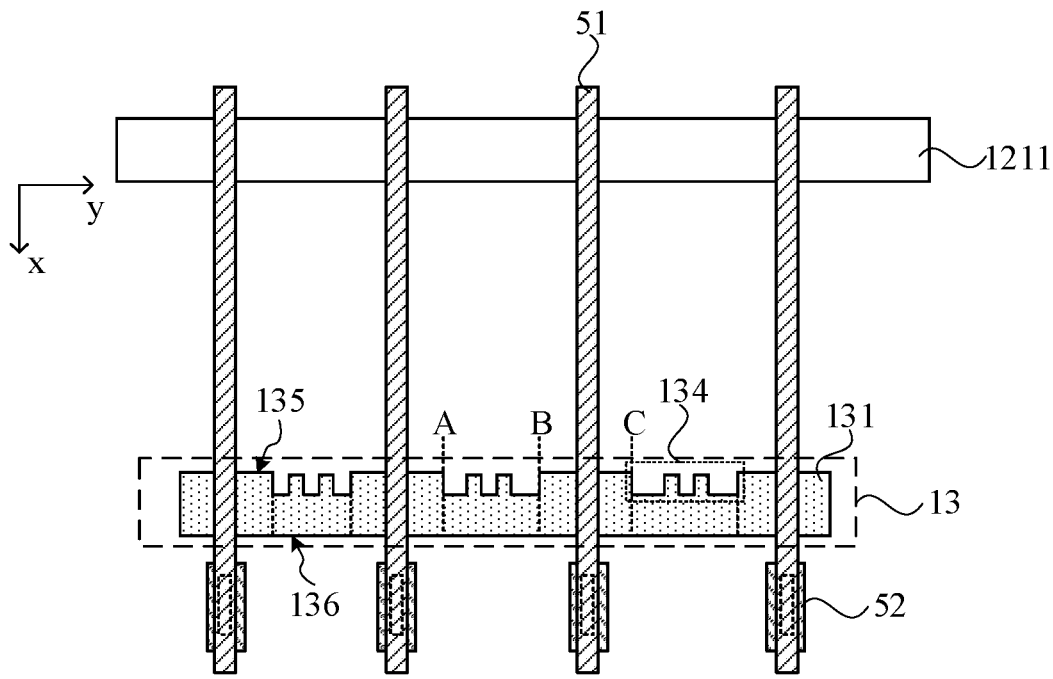
FIG. 12 is a schematic top view illustrating part of yet another touch display panel according to embodiments of the present disclosure.

It is to be understood that, in the embodiment shown in FIG. 8, two adjacent sub-blocking columns 131 are completely disconnected. In another embodiment, sub-blocking columns 131 between two adjacent touch wires 51 may not be completely disconnected. Exemplarily, FIGS. 11 and 12 are respectively a schematic top view illustrating part of another touch display panel according to embodiments of the present disclosure. Referring to FIG. 11 or FIG. 12, the blocking column 13 includes a blocking portion 133 disposed between two adjacent touch wires 51. The blocking portion 133 connects two adjacent sub-blocking columns 131. The blocking portion 133 includes a first edge 135 and a second edge 136 opposite to each other and along the first direction x. At least one of the first edge 135 or the second edge 136 includes an auxiliary edge structure 134. An edge extension direction of the auxiliary edge structure 134 differs from the second direction y.

As shown in FIG. 11, both the first edge 135 and the second edge 136 are provided with an auxiliary edge structure 134. Alternatively, as shown in FIG. 12, only the first edge 135 facing the display region is provided with an auxiliary edge structure 134. It is to be understood that the first edge 135 facing the display region is mainly configured to block an inorganic layer formed by CVD, and the first edge 135 is more easily short-circuited.

In an embodiment, the blocking column 13 not only includes the opening 132 as aforementioned, but also includes the blocking portion 133 with the auxiliary edge structure, both of which can reduce the risk of a short circuit between two adjacent touch wires.

It is to be understood that in this embodiment, the second direction y may refer to an extension direction in a horizontal direction. Accordingly, the extension direction of the auxiliary edge structure 134 is not in the horizontal direction, for example, maybe in a curved shape as shown in FIGS. 11 and 12. A path of the curved-shape is longer than a path in the horizontal direction. FIG. 12 exemplarily explains that the edge extension direction of the auxiliary edge structure 134 differs from the second direction y. As shown in FIG. 12, the auxiliary edge structure 134 includes a path AB. Under the premise that the path AB and the path BC have a same distance per unit length in the y direction, an edge extension direction of the path AB is in a curved shape or a folded-line shape, while an edge extension direction of the path BC is linear. Accordingly, it is to be understood that as for per unit length in the y direction, the length of the path AB is greater than the length of the path BC. That is, the auxiliary edge structure 134 (for example, the path AB) lengthens an extension path of a short circuit between two adjacent touch wires 51 and thus reduces the risk of a short circuit between two adjacent touch wires 51.

In embodiments of the present disclosure, by providing at least one of the first edge 135 or the second edge 135 with an auxiliary edge structure, the extension path of layer edges between two adjacent touch wires 51 is lengthened, thereby reduce the risk of a short circuit between different touch wires 51 caused by metal residues in the preparation of the touch wires 51. In a specific implementation, the shape of the auxiliary edge structure 134 is not limited.

Figure 13:
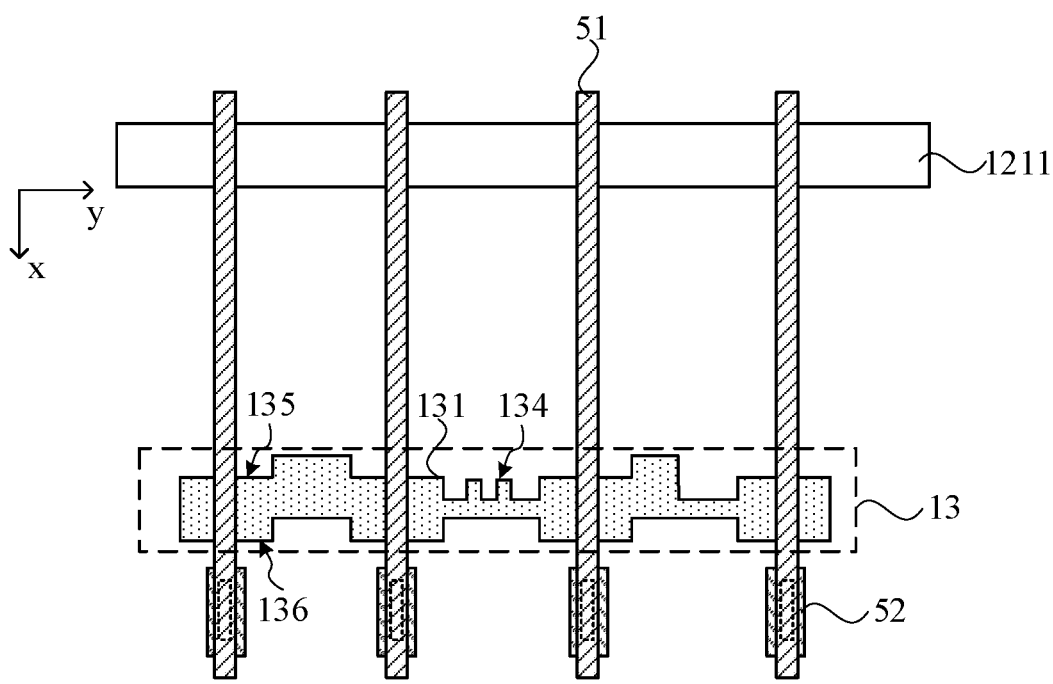
FIG. 13 is a schematic top view illustrating part of yet another touch display panel according to embodiments of the present disclosure.

In the embodiment according to FIG. 11, both the first edge 135 and the second edge 136 are recessed toward an interior of the blocking column 13. In the embodiment according to FIG. 12, the first edge 135 is recessed toward the interior of the blocking column 13. In other embodiments, the first edge 135 or the second edge 136 may protrude toward an exterior of the blocking column 13. FIG. 13 is a schematic top view illustrating part of another touch display panel according to embodiments of the present disclosure. As shown in FIG. 13, the auxiliary edge structure 134 includes at least one of a protrusion structure or a recess structure. By arranging a protrusion structure or a recess structure, the edge extension path of a blocking portion is lengthened. The auxiliary edge structure 134 disposed in the first edge 135 may include at least one protrusion structure, or include at least one recess structure, or include not only at least one protrusion structure but also at least one recess structure. In the embodiment shown in FIG. 13, both edges of the auxiliary edge structure 134 may be in a recess structure; alternatively, one edge is in a protrusion structure and the other edge is in a recess structure; alternatively, both edges are in a protrusion structure; and alternatively, part region of the auxiliary edge structure 134 is in a protrusion structure and another part of the auxiliary edge structure 134 is in a recess structure, which is no limited in this embodiment. In such an arrangement, the auxiliary edge structure lengthens the path causing a short circuit between two adjacent touch wires 51 and lengthens the extension path of the metal residues. Accordingly, the extension path of metal residues causing a short circuit is lengthened, and thus the risk of a short circuit between two adjacent wires 51 is reduced. The specific shape of an auxiliary edge structure may be a curved line, a folded line, an irregularly folded line, or an irregularly arc. The design may be made according to practical situations without any limitation herein.

In the preceding embodiments, the at least one blocking column is disposed in a region between the at least one wall and the touch terminals. For a better visual effect, display panels with narrow bezels are increasingly welcomed. To achieve a narrow bezel, the at least one blocking column and the touch terminal may overlap partially. A sub-blocking column at least partially surrounds a partial region of the touch terminal facing the at least one wall.

Figure 14:
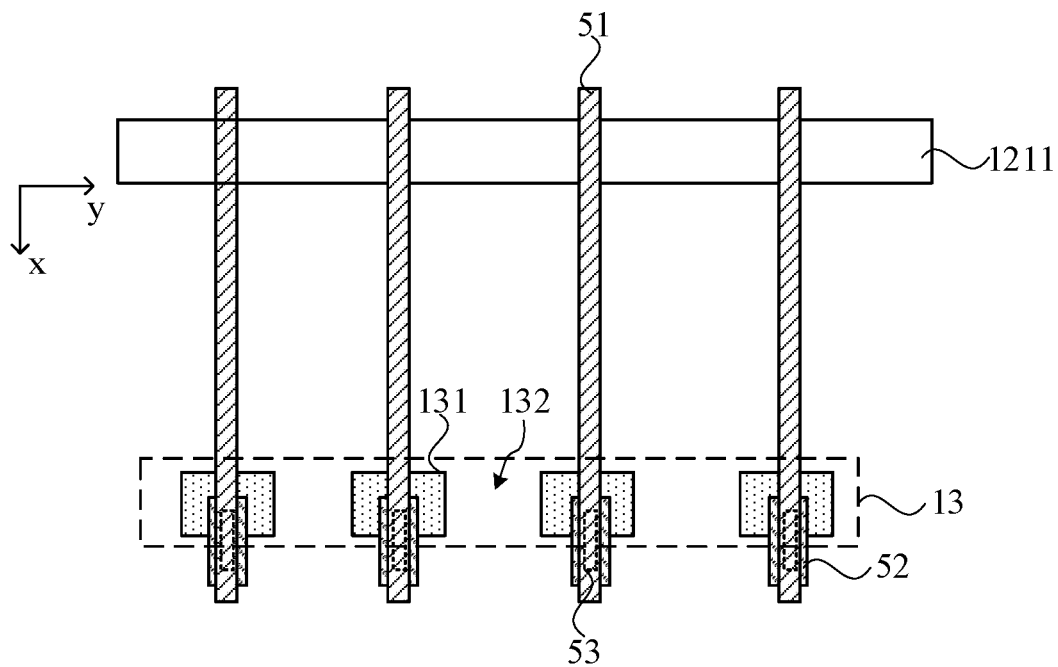
FIG. 14 is a schematic top view illustrating part of yet another touch display panel according to embodiments of the present disclosure.

Exemplarily, FIG. 14 is a schematic top view illustrating part of another touch display panel according to embodiments of the present disclosure. Referring to FIG. 14, the sub-blocking column 131 surrounds part of a via 53 through which a touch wire 51 is connected to a touch terminal 52. On an orthographic projection of the plane in which the touch display panel is located, the shape of the preceding sub-blocking column 131 is similar to a U-shaped structure so that the via 53 is semi-surrounded. That is, a reliable electrical connection between the touch wire 51 and the touch terminal 52 through the via 53 is ensured, and the reliability of the touch function is enhanced.

Figure 15:
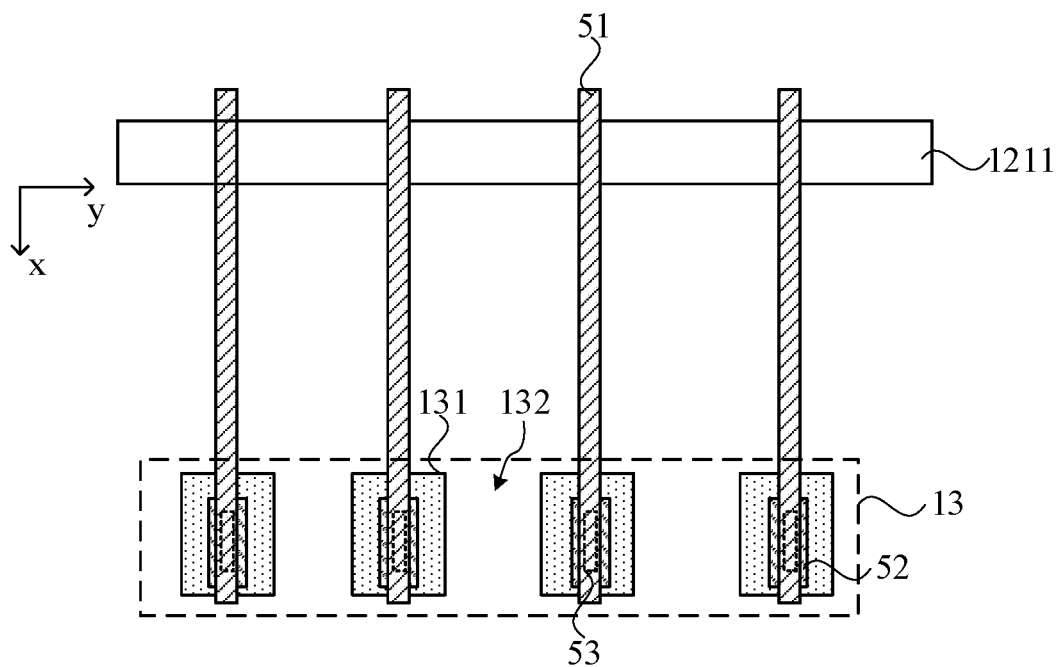
FIG. 15 is a schematic top view illustrating part of yet another touch display panel according to embodiments of the present disclosure.

FIG. 15 is a schematic top view illustrating part of another touch display panel according to embodiments of the present disclosure. Referring to FIG. 15, the sub-blocking column 131 completely surrounds a via 53 through which a touch wire 51 is connected to a touch terminal 52. That is, on the orthographic projection of the plane in which the touch display panel is located, the shape of the sub-blocking column 131 is similar to a ring structure so that the via 53 is surrounded completely. In a specific implementation, since the via 53 is disposed inside the touch terminal 52, the sub-blocking column 131 is configured to completely surround the touch terminal 52. It is to be understood that in the preparation of the display panel, a height of the at least one blocking column is relatively high in general, so as to block the inorganic encapsulation layer effectively. In the embodiments of FIGS. 14 and 15, the sub-blocking columns, in the preparation, are formed into a semi-annular shape or a U shape (FIG. 14) surrounding the vias 53, or into an annular shape (FIG. 15) surrounding the vias 53, to avoid forming a deep hole in the layers dissatisfying requirements of an actual process.

Figure 16:
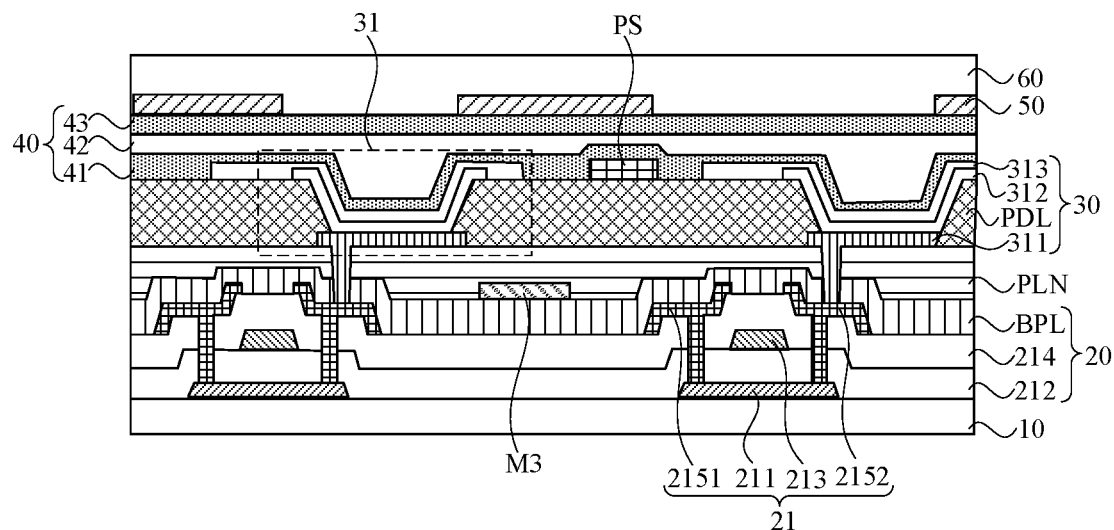
FIG. 16 is a schematic section view taken along line CC' of FIG. 3.

As for the layer structure in the display region 11, FIG. 16 is a schematic section view taken along line CC' of FIG. 3. Referring to FIG. 16, the touch display panel includes the substrate 10. The substrate 10 may be flexible, and thus may be extended, folded, bent, or curved. In this case, the touch display panel may be extended, folded, bent, or curved. The substrate 10 may be made of any suitable insulating materials with flexibility. The substrate 10 is configured to block oxygen and moisture, preventing moisture or impurities from diffusing through the substrate 10. A planar surface may be formed on an upper surface of the base substrate 10. The substrate 10 may be transparent, translucent, or opaque. The substrate 10 may further be rigid, for example, may be a glass substrate, thereby forming a rigid touch display panel.

An array layer 20 is disposed on a side of the substrate 10. Specifically, the array layer 20 is disposed on a side of the substrate 10 facing the display surface or a touch surface of the display panel 10. The array layer 20 may include a plurality of thin-film transistors (TFT) 21 and a pixel circuit formed by the thin-film transistors 21. The pixel circuit is configured to drive light-emitting elements in the display layer. Exemplarity, top-gate thin-film transistors are taken as an example for description in this embodiment. A thin-film transistor layer 21 includes an active layer 211 disposed on the substrate 10. The active layer 211 may be made of an amorphous silicon material, a polysilicon material, or a metal oxide material and the like. The active layer 211, when made of a polysilicon material, may be formed by using the low-temperature amorphous silicon technique. That is, an amorphous silicon material is made into a polysilicon material by laser melting. Moreover, the active layer 211 may be further formed by various methods such as the rapid thermal annealing (RTA) method, the solid phase crystallization (SPC) method, the excimer laser annealing (ELA) method, the metal-induced crystallization (MIC) method, the metal-induced lateral crystallization (MILC) method, or the succession lateral solidification (SLS). The active layer 211 further includes a source region and a drain region, and the source region and drain region are formed by doping N-type impurity ions or P-type impurity ions. A channel region is formed between the source region and the drain region. The array layer 20 further includes a gate insulating layer 212 disposed on the active layers 211. The gate insulating layer 212 includes an inorganic layer such as silicon oxide and silicon nitride, and may include one inorganic layer or a plurality of inorganic layers. The thin-film transistor layer 21 further includes a gate 213 disposed on the gate insulating layer 212. The gate 213 may include one layer or a plurality of layers of gold (Au), silver (Ag), copper (Cu), nickel (Ni), platinum (Pt), palladium (Pd), aluminum (Al), molybdenum (MO), chromium (Cr), or alloy such as aluminum (Al): neodymium (Nd) alloy or molybdenum (MO): tungsten (W), a selection thereof may be made according to actual situations in a specific implementation. The array layer 20 further includes an interlayer insulating layer 214 disposed on the gates 213. The interlayer insulating layer 214 may include an inorganic material or an organic material. The inorganic material may include at least one material selected from silicon nitride, aluminum nitride, zirconium nitride, titanium nitride, hafnium nitride, tantalum nitride, silicon oxide, aluminum oxide, titanium oxide, tin oxide, cerium oxide, to silicon oxynitride. The organic materials may include at least one material selected from acrylic resin, methacrylic resin, polyisoprene, vinyl resin, epoxy resin, urethane resin, cellulose resin, to perylene resin. The thin-film transistor 21 further includes a source electrode 2151 and a drain electrode 2151 that are disposed on the interlayer insulating layer 214. The source electrode 2151 and the drain electrode 2152 are electrically connected to the source region and the drain region through a contact aperture respectively. The contact aperture may be formed by selectively removing the gate insulating layer 212 and the interlayer insulating layer 214.

The array layer 20 may further include an organic insulating layer BPL. The organic insulating layer BPL is disposed on the source electrodes 2151 and the drain electrodes 2152 of the thin-film transistors 21. A third metal layer M3 is disposed above the organic insulating layer BPL. Various wires, such as a power supply voltage line, a scanning signal line, and a light-emitting control signal line, inside the touch panel, may be formed in the third metal layer M3, which may be arranged according to an actual structure of a panel in a specific implementation. The touch terminals 52 are disposed in a same layer as the third metal layer M3. The third metal layer M3 is disposed in a same layer as a certain layer of the metal layers in the array layer, for example. The certain layer may be a metal layer in a same layer as an anode layer of the light-emitting elements, or may be a metal layer in a same layer as the source electrodes 2151 and the drain electrodes 2152 of the thin-film transistors in the array layer, which is not limited in embodiments of the present disclosure. The touch display panel may further include a planarization layer PLN. The planarization layer PLN is disposed on the organic insulating layer BPL. The planarization layer 23 may include organic materials, such as acryl, polyimide (PI), or benzocyclobutene (BCB). The planarization layer 23 is configured to perform a function of planarizing.

A display layer 30 is disposed on a side of the array layer 20 facing away from the substrate 10. The display layer 30 includes a plurality of light-emitting elements 31. The display layer 30 is disposed on the planarization layer PLN. The display layer 30 includes an anode layer 311, an intermediate layer 312, and a cathode layer 313 that are sequentially disposed along a direction facing away from the substrate 10. The anode layer 311 may be made of various conductive materials. For example, the anode layer 311 may be formed into a transparent electrode or a reflective electrode according to its usage. In a case where the anode layer is formed into a transparent electrode, the transparent electrode may include indium tin oxide (ITO), indium zinc oxide (IZO), zinc oxide (ZnO), indium oxide (In2O3), or the like. In a case where the anode layer is formed into a reflective electrode, the reflective electrode may be made of silver (Ag), magnesium (Mg), aluminum (Al), platinum (Pt), palladium (Pd), gold (Au), nickel (Ni), neodymium (Nd), iridium (Ir), chromium (Cr), or a mixture thereof. Further, ITO, IZO, ZnO, In2O3, or the like may be formed on the reflective electrode The intermediate layer 312 may include low molecular materials or high molecular materials. In a case where the intermediate layer 312 includes low molecular materials, the intermediate layer 312 may include an emission layer (EML), and may further include at least one of a hole injection layer (HIL), a hole transport layer (HTL), an electron transport layer (ETL), or an electron injection layer (EIL). The intermediate layer 312 may include various organic materials, such as copper phthalocyanine (CuPc), N, N'-bis (naphthalen-1-yl)-N, N'-diphenyl-benzidine (NPB), or tris-8-hydroxyquinoline-aluminum (Alq3). The intermediate layer 312 may be formed through vapor deposition.

In a case where the intermediate layer 312 includes high molecular materials, the intermediate layer 312 may include an HTL and an EML. The HTL may include Poly (3,4-ethylene dioxythiophene) (PEDOT). The EML may include polyphenylene vinylene (PPV)-based and polyfluorene-based high molecular materials. The intermediate layer 312 may be formed through screen printing, ink-jet printing, laser-induced thermal imaging (LITI) or the like.

Nonetheless, the intermediate layer 312 is not limited to the preceding embodiments. The intermediate layer 312 may include a single layer across a plurality of anode layers 311 or a plurality of layers patterned in terms of each anode layer 311. The display panel 30 further includes a pixel-defining layer PDL disposed on a side of the anode layer 311 facing away from the array layer 20. The pixel-defining layer PDL may be made of organic materials such as polyimide (PI), polyamide, BenzoCycloButene (BCB), acrylic resin, phenolic resin or the like. In a case where the cathode layer 313 is formed into a transparent electrode, a compound with a small work function such as lithium (Li), calcium (Ca), lithium fluoride/calcium (LiF/Ca), lithium fluoride/aluminum (LiF/Al), aluminum (Al), magnesium (Mg), or a combination thereof may be initially deposited on a light-emitting layer by evaporation. The materials forming a transparent electrode, such as ITO, IZO, ZnO, or In2O3, may be deposited on this compound. In a case where the cathode layer 313 is formed into a reflective electrode, the cathode layer 313 may be formed by evaporating Li, Ca, LiF/Ca, LiF/Al, Al, Mg, or a mixture thereof on an entire surface of the substrate.

The anode layer 311 includes a plurality of anode patterns that are in one-to-one correspondence to pixels. The anode patterns in the anode layer 311 are connected to the source electrodes 2151 or the drain electrodes 2152 of the thin-film transistors 21 through vias on the planarization layer PLN. The pixel-defining layer PDL includes a plurality of openings for exposing the anode layer 311. Moreover, the pixel-defining layer PDL may cover edges of the patterns of the anode layer 311. The intermediate layer 312 is at least partially filled in the openings in the pixel-defining layer PDL and is in contact with the anode layer 311.

The anode layer 311, the intermediate layer 312, and the cathode layer 313 that are defined by an opening in the pixel-defining layer PDL constitute one light-emitting element 31 (that is, the region in the dotted box in FIG. 16). Each light-emitting element 31 may emit light of different colors according to different intermediate layers 312. Each light-emitting element 31 constitutes one sub-pixel. A plurality of sub-pixels jointly display an image.

The touch display panel further includes the encapsulation layer 40 disposed on the display layer 30. The encapsulation layer 40 completely covers the display layer 30 to seal the display layer 30. The encapsulation layer 40 may be a thin-film encapsulation layer. Exemplarily, the encapsulation layer 40 includes the first inorganic layer 41, the first organic layer 42, and the second inorganic layer 43. The first inorganic layer 41, the first organic layer 42, and the second inorganic layer 43 are stacked to prevent water and oxygen from corroding the light-emitting elements 31. In embodiments of the present disclosure, the encapsulation layer 40 may include any number of organic material layers and any number of inorganic material layers that are stacked, as required. Nonetheless, at least one organic material layer and at least one inorganic material layer are deposited alternately, with the lowermost layer and the uppermost layer made of inorganic materials.

The touch display panel further includes the touch layer 50 disposed on the encapsulation layer 40. The touch layer 50 includes a plurality of touch electrodes to implement a touch function and may be in self-capacitance or in mutual capacitance in a specific implementation. The touch layer 50 may be provided with the touch electrodes in a single layer or the touch electrodes in double layers. The touch layer 50 may be further provided with touch electrodes in a metal-mesh shape. The touch electrodes in a metal-mesh shape include a plurality of metal wires extending along two intersecting directions. The metal wires extending along different directions form a mesh. In other embodiments, the touch layer 50 may be disposed inside the encapsulation layer 40. The selection may be made according to actual situations in a specific implementation.

The touch display panel further includes a protective layer 60 disposed on the display layer 30. The protective layer 60 is the outermost film layer of the touch display panel and may be a protective cover plate or a protective film. The protective layer 60 may be attached to an adjacent layer inside the touch display panel by using an optically clear adhesive (OCA). A surface of the protective layer 60 is a surface for touch operation of the display panel. A post-support PS is disposed on the display layer 30 to avoid a possible effect of the protective cover plate on the light-emitting elements.

Figure 17:
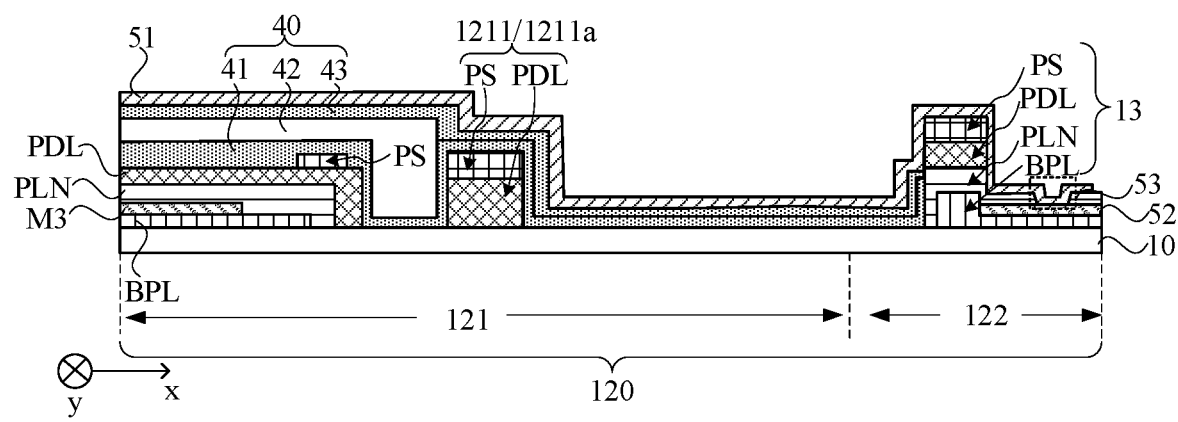
FIG. 17 is a schematic section view taken along line EE' of FIG. 3.

In another embodiment, FIG. 17 is a schematic section view taken along line EE' of FIG. 3. Referring to FIG. 17, the touch display panel provided in embodiments of the present disclosure further includes a pixel-defining layer PDL, the post-support PS, the planarization layer PLN, the organic insulating layer BPL, and the third metal layer M3. The pixel-defining layer PDL disposed on a side of the substrate 10 includes pixel openings. The pixel openings are light-emitting regions of the light-emitting elements. Each light-emitting element includes an anode disposed on the anode layer (referring to FIG. 16 for a specific structure of the display region). The post-support PS is disposed on a side of the pixel-defining layer PDL facing away from the substrate 10. The planarization layer PLN is disposed on a side of the pixel-defining layer PDL facing away from the substrate 10. The organic insulating layer BPL is disposed on a side of the planarization layer PLN facing the substrate 10. The third metal layer M3 is disposed on a side of the anode layer (not illustrated in FIG. 17) facing the substrate 10 and disposed between the organic insulating layer BPL and the planarization layer PLN. A blocking column 13 includes at least two sub-layers being stacked. Exemplarily, the embodiment of FIG. 17 shows that a blocking column 13 includes four sub-layers being stacked. The four sub-layers are disposed in a same layer as the organic insulating layer BPL, the planarization layer PLN, the pixel-defining layer PDL, and the post-support PS in the display region respectively.

It is to be understood that FIG. 17 only exemplarily illustrates that the blocking column 13 includes four sub-layers being stacked. In a specific implementation, only organic layers that in a same layer as at least two of the organic insulating layer BPL, the planarization layer PLN, the pixel-defining layer PDL, and the post-support PS are needed to be disposed, which is not limited in embodiments of the present disclosure.

In an embodiment, as shown in FIG. 17, the wall 1211 includes a first wall 1211*a*. The first wall 1211*a* includes at least two first layers being stacked. Exemplarily, FIG. 17 illustrates that two first layers included in the first wall 1211*a* are in a same layer as the pixel-defining layer PDL and the post-support PS respectively. Moreover, the first wall 1211*a* includes and is not limited to include the preceding two first layers being stacked. The first wall 1211*a* may include three first layers being stacked. Specifically, the three first layers, for example, may be disposed in a same layer as the planarization layer PLN, the pixel-defining layer PDL, and the post-support PS respectively, or disposed in a same layer as the organic insulating layer BPL, the planarization layer PLN, and the pixel-defining layer PDL respectively. The design may be made according to actual situations in a specific implementation.

Figure 18:
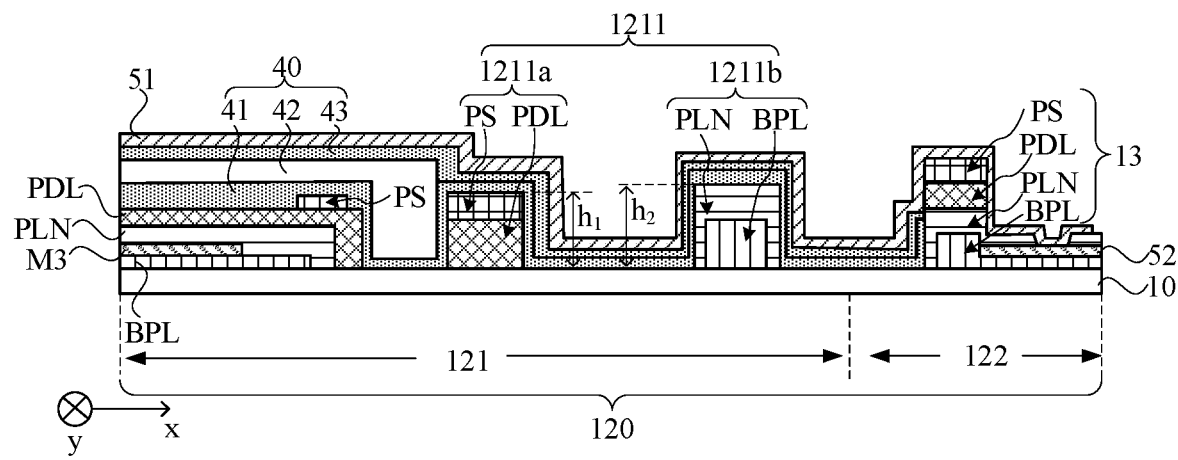
FIG. 18 is another schematic section view taken along line EE' of FIG. 3.

In another embodiment, FIG. 18 is another schematic section view taken along line EE' of FIG. 3. As shown in FIG. 18, the wall 1211 includes the first wall 1211a and the second wall 1211b. The first wall 1211a includes two first layers disposed in the same layer as the pixel-defining layer PDL and the post-support PS respectively. The second wall 1211b includes two second layers disposed in a same layer as the organic insulating layer BPL and the planarization layer PLN respectively.

It is to be noted that FIG. 18 only exemplarily illustrates the first wall 1211a including two first layers disposed in the same layer as the pixel-defining layer PDL and the post-support PS respectively, and the second wall 1211b including two second layers disposed in the same layer as the organic insulating layer BPL and the planarization layer PLN respectively, rather than limits embodiments of the present disclosure. In other embodiments, the first wall 1211a and the second wall 1211b may include other numbers of organic film layers, such as one layer, three layers, or more layers. For example, the first wall 1211a includes a layer disposed in the same layer as the organic insulating layer BPL; the second wall 1211b includes three layers disposed in the same layer as the planarization layer PLN, the pixel-defining layer PDL, and the post-support PS respectively. The first wall 1211a and the second wall 1211b may include a same number of layers or layers in a same layer. The selection may be made according to actual situations in a specific implementation.

With continued reference to FIG. 18, in a direction perpendicular to the plane in which the touch display panel is located, the height h2 of the second wall 1211b is greater than the height h1 of the first wall 1211a.

It is to be understood that, in the preparation of the touch display panel, since the processing thicknesses of various layer are different, the height h2 of the second wall 1211b may be set greater than the height hl of the first wall 1211a when different layers are used in the second wall 1211b and the first wall 1211a. Exemplarily, in an embodiment, the height of the first wall 1211a may be set to 2.7 µm, and the height of the second wall 1211b may be set to 3.4 µm. By arranging the height of the second wall 1211b being greater than the height of the first wall 1211a, an organic layer in the encapsulation layer is effectively prevented from overflowing, the extension path of an inorganic layer is lengthened, thereby enhancing the effect of blocking water and oxygen.

Figure 19:
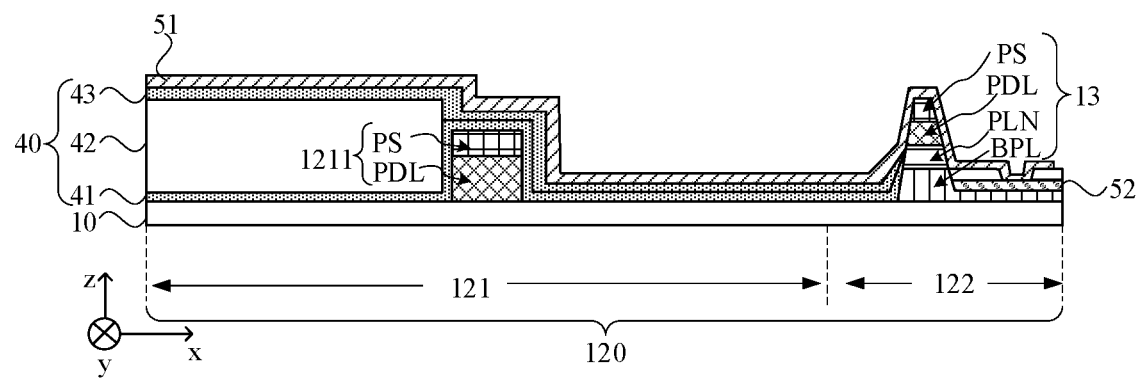
FIG. 19 is yet another schematic section view taken along a line EE' in FIG. 3.

Exemplarily, FIG. 19 is another schematic section view taken along a line EE' in FIG. 3. Referring to FIG. 19, along a direction z from the substrate pointing toward the encapsulation layer, widths of the four sub-layers are sequentially reduced, and sections of the four sub-layers is trapezoidal. In such a way, edges of the four sub-layers are on different levels, and an excessive difference therein is avoided, thereby reducing the risk that a touch wire 51 is fractured.

With continued reference to FIG. 17 or 19, in a direction perpendicular to the plane in which the touch display panel is located, the height of the blocking column 13 is greater than the height of a wall 1211. By arranging the height of the blocking column 13 being greater than the height of a wall 1211, the at least one blocking column 13 is able to effectively prevent the first inorganic layer 41 and/or the second inorganic layer 43 from extending to the touch terminals 52 which would cause abnormal contact between the touch wires 51 and the touch terminals 52.

With continued reference to FIG. 17, a touch wire 51 extends along the surfaces of the wall 1211a, the wall 1121b, and the at least one blocking column 13 to a second region 122. The touch wire 51 is electrically connected to a touch terminal 52 through a via 53 on part of layers in the second region 122. In a specific implementation, along an extension direction of the substrate 10, a region (not illustrated in FIG. 17) on a side of the touch terminal 52 facing away from the at least one blocking column 13 may be arranged as a bent region to narrow the bezel of the touch display panel.

Figure 20:
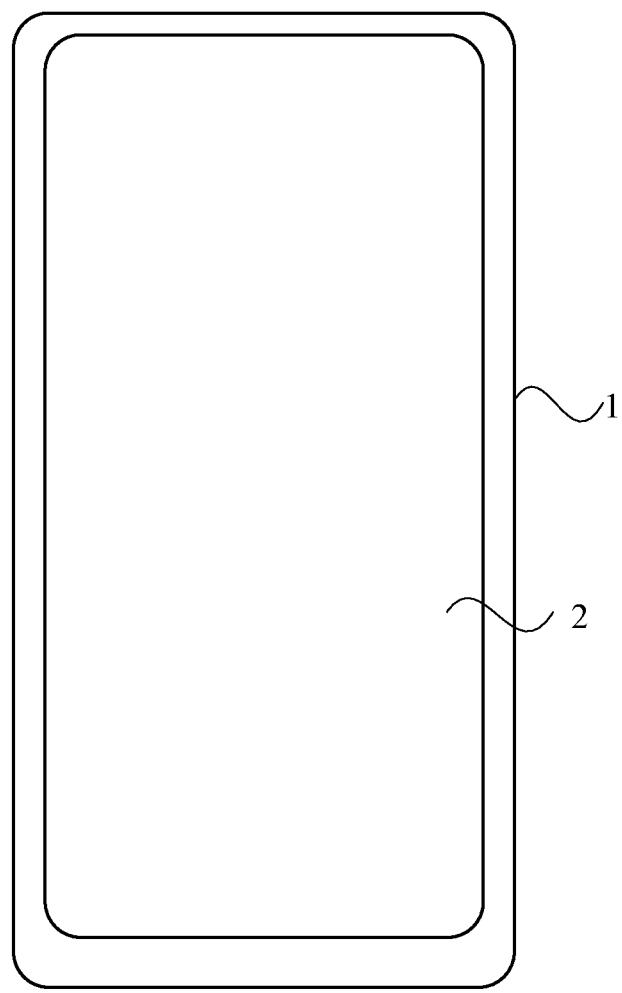
FIG. 20 is a schematic view illustrating a structure of a touch display device according to embodiments of the present disclosure.

FIG. 20 is a view illustrating the structure of a touch display device according to embodiments of the present disclosure. Referring to FIG. 20, the touch display device 1 includes any touch display panel 2 provided in embodiments of the present disclosure. Specifically, the touch display device 1 may be, for example, a mobile phone, a computer, or an intelligent wearable device.

It is to be noted that the preceding are only preferred embodiments of the present disclosure and the technical principles used therein. It is to be understood by those skilled in the art that the present disclosure is not limited to the embodiments described herein. For those skilled in the art, various apparent modifications, adaptations, combinations, and substitutions can be made without departing from the scope of the present disclosure. Therefore, while the present disclosure has been described in detail via the preceding embodiments, the present disclosure is not limited to the preceding embodiments and may include more equivalent embodiments without departing from the inventive concept of the present disclosure. The scope of the present disclosure is determined by the scope of the appended claims.

What is claimed is:

1. A touch display panel, comprising:
   a substrate comprising a display region and a non-display region, wherein the non-display region comprises a step region;
   light-emitting elements disposed in the display region;
   an encapsulation layer covering the light-emitting elements and at least part of the non-display region and comprising at least one inorganic layer and at least one organic layer, and wherein the at least one inorganic layer and the at least one organic layer are stacked;
   a touch layer disposed on a side of the at least one inorganic layer facing away from the light-emitting elements, wherein the touch layer comprises a plurality of touch electrodes; and
   a plurality of touch wires connected to the plurality of touch electrodes and extending to the non-display region along a first direction,
   wherein the step region comprises a first region and a second region, wherein the first region is disposed adjacent the display region, wherein the second region is disposed on a side of the first region facing away from the display region, wherein the first region comprises at least one wall, wherein the second region comprises a plurality of touch terminals, and wherein at least part of the plurality of touch terminals are electrically connected to at least part of the plurality of touch wires in a one-to-one manner;
   wherein the second region comprises at least one blocking column extending along a second direction, wherein the first direction and the second direction intersect, and wherein in a direction perpendicular to a plane in which the substrate is located, the at least one blocking column overlaps the plurality of touch wires extending to the non-display region;
   wherein at least part of the at least one blocking column is disposed between the plurality of touch terminals and the at least one wall, and wherein the at least one blocking column is configured to prevent the at least one inorganic layer disposed between the touch layer and the substrate and in the encapsulation layer from extending to the plurality of touch terminals;

wherein the at least one blocking column comprises a plurality of sub-blocking columns, wherein in the direction perpendicular to the plane in which the substrate is located, one sub-blocking column of the plurality of sub-blocking columns overlaps one touch wire of the plurality of touch wires;

wherein a width of the one sub-blocking column in the second direction is greater than or equal to a width of one touch terminal of the plurality of touch terminals in the second direction; and wherein (i) one opening of at least one opening is disposed between two adjacent sub-blocking columns of the plurality of sub-blocking columns, wherein the one opening is disposed between two adjacent touch wires of the plurality of touch wires; or (ii) the at least one blocking column comprises a blocking portion disposed between two adjacent ones of the plurality of touch wires, wherein (a) the blocking portion connects two adjacent ones of the plurality of sub-blocking columns, (b) the blocking portion comprises a first edge and a second edge opposite to each other and along the first direction, (c) at least one of the first edge or the second edge comprises an auxiliary edge structure, and (d) an edge extension direction of the auxiliary edge structure differs from the second direction.

2. The touch display panel of claim 1, wherein in a case where the at least one blocking column comprises a blocking portion disposed between two adjacent ones of the plurality of touch wires, and wherein the blocking portion connects two adjacent ones of the plurality of sub-blocking columns, the blocking portion comprises a first edge and a second edge opposite to each other and along the first direction, wherein at least one of the first edge or the second edge comprises an auxiliary edge structure, an edge extension direction of the auxiliary edge structure differs from the second direction, and the auxiliary edge structure comprises at least one protrusion structure or recess structure.

3. The touch display panel of claim 1, wherein the one sub-blocking column at least partially surrounds a partial region of the one touch terminal facing the at least one wall.

4. The touch display panel of claim 3, wherein the one sub-blocking column completely surrounds the one touch terminal.

5. The touch display panel of claim 1, wherein the encapsulation layer comprises a first inorganic layer, a first organic layer, and a second inorganic layer, and wherein the first inorganic layer, the first organic layer, and the second inorganic layer are stacked;

wherein the touch layer is disposed on a side of the second inorganic layer facing away from the first organic layer; and wherein the first organic layer extends to a side of the at least one wall facing the display region, and wherein at least one of the first inorganic layer or the second inorganic layer extends at most to a side of the at least one blocking column facing the at least one wall.

6. The touch display panel of claim 5, wherein the first inorganic layer and the second inorganic layer have a same cutoff position in the non-display region.

7. The touch display panel of claim 5, wherein a cutoff position of the first inorganic layer in the non-display region is disposed on a side of a cutoff position of the second inorganic layer in the non-display region facing the display region.

8. The touch display panel of claim 1, further comprising:

a pixel-defining layer disposed on a side of the substrate, wherein the pixel-defining layer comprises pixel openings, wherein the pixel openings are light-emitting regions of the light-emitting elements, and wherein each light-emitting element of the light-emitting elements comprises an anode disposed in an anode layer;

a post-support disposed on a side of the pixel-defining layer facing away from the substrate;

a planarization layer disposed on a side of the pixel-defining layer facing the substrate;

an organic insulating layer disposed on a side of the planarization layer facing the substrate; and a third metal layer disposed on a side of the anode layer facing the substrate, wherein the third metal layer is disposed between the organic insulating layer and the planarization layer, wherein the at least one blocking column comprises at least two sub-layers being stacked, and wherein the at least two sub-layers are disposed in a same layer as at least two of the organic insulating layer, the planarization layer, the pixel-defining layer, and the post-support.

9. The touch display panel of claim 8, wherein each wall of the at least one wall comprises a first wall, and wherein the first wall comprises at least two first layers being stacked, wherein the at least two first layers are in a same layer as the pixel-defining layer and the post-support respectively.

10. The touch display panel of claim 9, wherein the each wall further comprises a second wall, and wherein the second wall comprises at least two second layers being stacked, wherein the at least two second layers are in a same layer as the organic insulating layer and the planarization layer respectively.

11. The touch display panel of claim 10, wherein in the direction perpendicular to the plane in which the touch display panel is located, a height of the second wall is greater than a height of the first wall.

12. The touch display panel of claim 8, wherein the at least one blocking column comprises four sub-layers being stacked, and wherein the four sub-layers are disposed in a same layer as the organic insulating layer, the planarization layer, the pixel-defining layer, and the post-support respectively, wherein areas of projections of the four sub-layers on the substrate decrease progressively along a direction toward the encapsulation layer from the substrate.

13. The touch display panel of claim 8, wherein the plurality of touch terminals are disposed in a same layer as the third metal layer.

14. The touch display panel of claim 1, wherein in the direction perpendicular to the plane in which the touch display panel is located, a height of the at least one blocking column is greater than a height of the at least one wall.

15. The touch display panel of claim 1, wherein each touch wire of the plurality of touch wires extends to the second region along a surface of the at least one wall and a surface of the at least one blocking column and is electrically connected to each touch terminal of the plurality of touch terminals through a via in part of layers in the second region.

16. A touch display panel, comprising:
a substrate comprising a display region and a non-display region, wherein the non-display region comprises a step region;
light-emitting elements disposed in the display region;
an encapsulation layer covering the light-emitting elements and at least part of the non-display region and comprising at least one inorganic layer and at least one organic layer, wherein the at least one inorganic layer and the at least one organic layer are stacked;
a touch layer disposed on a side of the at least one inorganic layer facing away from the light-emitting elements, and wherein the touch layer comprises a plurality of touch electrodes; and
a plurality of touch wires connected to the plurality of touch electrodes and extending to the non-display region along a first direction,
wherein the step region comprises a first region and a second region, wherein the first region is disposed adjacent the display region, wherein the second region is disposed on a side of the first region facing away from the display region, wherein the first region comprises at least one wall, wherein the second region comprises a plurality of touch terminals, and wherein at least part of the plurality of touch terminals are electrically connected to at least part of the plurality of touch wires in a one-to-one manner;
wherein the second region comprises at least one blocking column extending along a second direction, wherein the first direction and the second direction intersect, and wherein in a direction perpendicular to a plane in which the substrate is located, the at least one blocking column overlaps the plurality of touch wires extending to the non-display region;
wherein at least part of the at least one blocking column is disposed between the plurality of touch terminals and the at least one wall, and wherein the at least one blocking column is configured to prevent the at least one inorganic layer disposed between the touch layer and the substrate and in the encapsulation layer from extending to the plurality of touch terminals;
wherein the encapsulation layer comprises a first inorganic layer, a first organic layer, and a second inorganic layer, and wherein the first inorganic layer, the first organic layer, and the second inorganic layer are stacked along a direction of light emission of the touch display panel;
wherein the touch layer is disposed between the first inorganic layer and the first organic layer; and
wherein the first organic layer extends to a side of the at least one wall facing the display region, and wherein the first inorganic layer extends at most to a side of the at least one blocking column facing the at least one wall.

17. The touch display panel of claim 16, further comprising:
a pixel-defining layer disposed on a side of the substrate, wherein the pixel-defining layer comprises pixel openings, wherein the pixel openings are light-emitting regions of the light-emitting elements, and wherein each light-emitting element of the light-emitting elements comprises an anode disposed in an anode layer;
a post-support disposed on a side of the pixel-defining layer facing away from the substrate;
a planarization layer disposed on a side of the pixel-defining layer facing the substrate;
an organic insulating layer disposed on a side of the planarization layer facing the substrate; and
a third metal layer disposed on a side of the anode layer facing the substrate, wherein the third metal layer is disposed between the organic insulating layer and the planarization layer,
wherein the at least one blocking column comprises at least two sub-layers being stacked, and wherein the at least two sub-layers are disposed in a same layer as at least two of the organic insulating layer, the planarization layer, the pixel-defining layer, and the post-support.

18. The touch display panel of claim 17, wherein each wall of the at least one wall comprises a first wall, and wherein the first wall comprises at least two first layers being stacked, wherein the at least two first layers are in a same layer as the pixel-defining layer and the post-support respectively.

19. The touch display panel of claim 18, wherein the each wall further comprises a second wall, and wherein the second wall comprises at least two second layers being stacked, wherein the at least two second layers are in a same layer as the organic insulating layer and the planarization layer respectively.

20. The touch display panel of claim 19, wherein in the direction perpendicular to the plane in which the touch display panel is located, a height of the second wall is greater than a height of the first wall.

* * * * *